United States Patent
Park et al.

(10) Patent No.: US 9,855,608 B2
(45) Date of Patent: Jan. 2, 2018

(54) HARD COATING FILM FOR CUTTING TOOLS

(71) Applicant: KORLOY INC., Seoul (KR)

(72) Inventors: Je-Hun Park, Chungcheongbuk-do (KR); Seung-Su Ahn, Chungcheongbuk-do (KR); Sung-Gu Lee, Chungcheongbuk-do (KR); Seoun-Yong Ahn, Chungcheongbuk-do (KR); Young Heum Kim, Chungcheongbuk-do (KR)

(73) Assignee: KORLOY INC., Seoul (KR)

( * ) Notice: Subject to any disclaimer, the term of this patent is extended or adjusted under 35 U.S.C. 154(b) by 0 days.

(21) Appl. No.: 14/915,905

(22) PCT Filed: Aug. 27, 2014

(86) PCT No.: PCT/KR2014/007962
§ 371 (c)(1),
(2) Date: Mar. 2, 2016

(87) PCT Pub. No.: WO2015/034203
PCT Pub. Date: Mar. 12, 2015

(65) Prior Publication Data
US 2016/0193662 A1    Jul. 7, 2016

(30) Foreign Application Priority Data
Sep. 9, 2013  (KR) .................. 10-2013-0107733

(51) Int. Cl.
*C23C 28/04*  (2006.01)
*B23B 27/14*  (2006.01)
(Continued)

(52) U.S. Cl.
CPC .......... *B23B 27/14* (2013.01); *C23C 14/0641* (2013.01); *C23C 28/042* (2013.01);
(Continued)

(58) Field of Classification Search
CPC ....... B23B 27/14; B23B 2224/24; B23B 9/00; C23C 14/0641; C23C 28/042; C23C 28/044; C23C 28/42
(Continued)

(56) References Cited

U.S. PATENT DOCUMENTS

| | | | |
|---|---|---|---|
| 5,330,853 A | * | 7/1994 | Hofmann ............ C23C 14/0084 407/117 |
| 7,923,130 B2 | | 4/2011 | Shibata et al. |
| 8,507,109 B2 | | 8/2013 | Kim et al. |

FOREIGN PATENT DOCUMENTS

| | | |
|---|---|---|
| KR | 10-2005-0002178 A | 1/2005 |
| KR | 10-2006-0065321 A | 6/2006 |

(Continued)

OTHER PUBLICATIONS

WO 2013081232—WIPO Patentscope Translation; Abstract and Full Text; Jun. 6, 2013 ; Park et al.*

(Continued)

*Primary Examiner* — Samir Shah
*Assistant Examiner* — Elizabeth Ivey
(74) *Attorney, Agent, or Firm* — Revolution IP, PLLC

(57) ABSTRACT

Disclosed is a hard coating film formed on a hard base material such as cemented carbide. The hard coating film has a nanoscale multilayered structure to have improved oxidation resistance and wear resistance. The hard coating film is a hard coating film formed on the base material. The first layer is composed of a TiAl nitride having a composition of $Ti_{1-a}Al_a$ ($0.3 \leq a \leq 0.7$), and the second layer has a nanoscale multilayered structure or a structure in which the nanoscale multilayered structure is repeatedly laminated at least two times, the nanoscale multilayered structure including a thin layer A composed of an AlTiSi nitride, a thin layer B, a thin layer C composed of a AlCr nitride, and a thin layer D (Continued)

having thicknesses of 3 nm to 20 nm. The thin film B and the thin film D are composed of a TiAl nitride.

4 Claims, 9 Drawing Sheets

(51) Int. Cl.
*C23C 14/06* (2006.01)
*C23C 28/00* (2006.01)

(52) U.S. Cl.
CPC ............ *C23C 28/044* (2013.01); *C23C 28/42* (2013.01); *B23B 2224/24* (2013.01)

(58) Field of Classification Search
USPC .......................... 428/216, 336, 697, 698, 699
See application file for complete search history.

(56) References Cited

FOREIGN PATENT DOCUMENTS

| KR | 10-0876366 B1 | 12/2008 | |
|---|---|---|---|
| KR | 10-0900529 B1 | 6/2009 | |
| KR | 10-2013-0060542 A | 6/2013 | |
| KR | WO 2013081232 * | 6/2013 | ............ C23C 14/06 |
| KR | 1284766 B1 | 7/2013 | |

OTHER PUBLICATIONS

International Search Report for PCT/KR2014/007962 dated Dec. 23, 2014 from Korean Intellectual Property Office.

* cited by examiner

[FIG. 1]
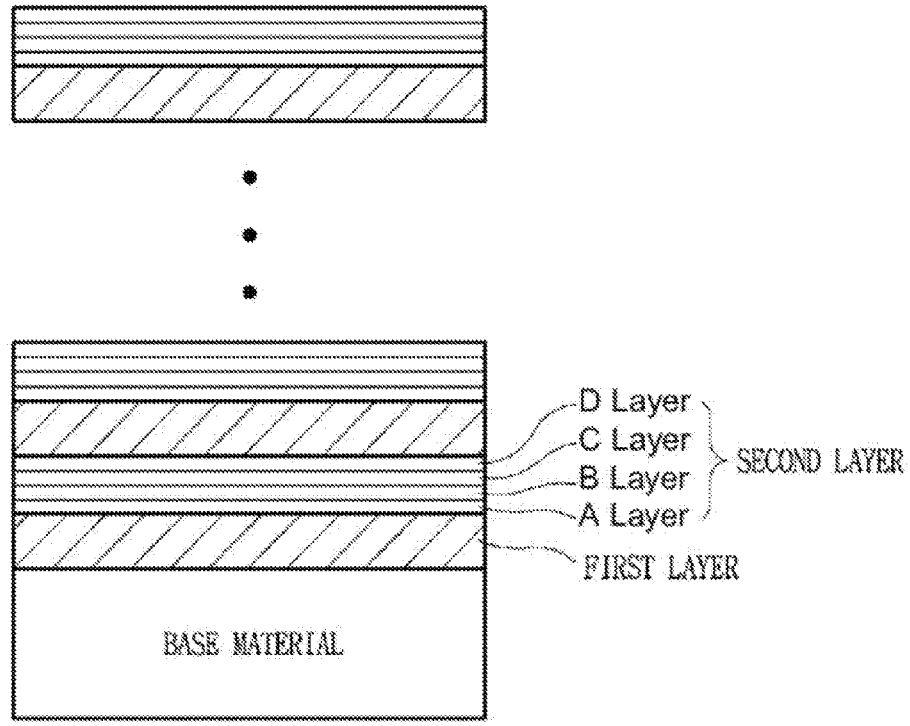
[FIG. 2]
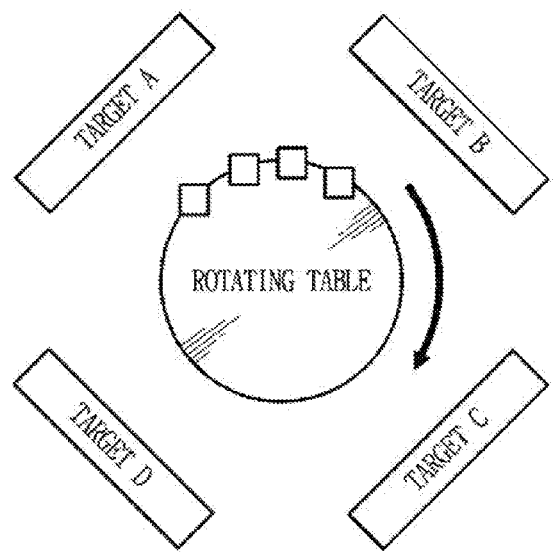

[FIG. 3]

| CLASSIFICATION | SPECIMEN | THIN FILM STRUCTURE ||||||| LAMINATED STRUCTURE |
|---|---|---|---|---|---|---|---|---|
| | | SINGLE LAYER || NANOSCALE MULTILAYER ||||| |
| | | SINGLE LAYER (TARGET COMPOSITION) | THICKNESS (μm) | NANOSCALE MULTILAYER (TARGET COMPOSITION) | THICKNESS (μm) | LAMINATION INTERVAL (NUMBER) | TOTAL THICKNESS (μm) | |
| COMPARATIVE EXAMPLE | 1 | TiAlN(5:5) | 4.2 | — | — | — | 4.2 | SINGLE |
| | 2 | AlTiN(67:33) | 4.1 | — | — | — | 4.1 | SINGLE |
| | 3 | AlCrN(5:5) | 4.2 | — | — | — | 4.2 | SINGLE |
| | 4 | AlCrN(7:3) | 4.2 | — | — | — | 4.2 | SINGLE |
| | 5 | — | — | TiAlN(5:5)/AlCrN(7:3) | 4.3 | 20 | 4.3 | MULTILAYER |
| | 6 | — | — | AlTiN(67:33)/AlCrN(7:3) | 4.2 | 19 | 4.2 | MULTILAYER |
| | 7 | — | — | TiAlN(5:5)/AlCrN(5:5) | 4.2 | 18 | 4.2 | MULTILAYER |
| | 8 | — | — | AlTiN(67:33)/AlCrN(5:5) | 4.3 | 19 | 4.3 | MULTILAYER |
| | 9 | — | — | AlTiN(67:33)/TiAlN(5:5)/AlCrN(5:5)/TiAlN(5:5) | 4.0 | 18 | 4.0 | MULTILAYER |
| | 10 | — | — | AlTiN(67:33)/TiAlN(5:5)/AlCrN(7:3)/TiAlN(5:5) | 4.2 | 19 | 4.2 | MULTILAYER |
| | 11 | TiAlN(5:5) | 0.07 | AlTiN(67:33)/AlCrN(7:3)/TiAlN(5:5) | 0.16 | 20 | 4.1 | SINGLE/MULTILAYER |
| EXAMPLE | 12 | TiAlN(67:33) | 0.07 | AlTiN(67:33)/AlCrN(7:3)/TiAlN(5:5) | 0.17 | 19 | 4.3 | SINGLE/MULTILAYER |
| | 13 | TiAlN(5:5) | 0.16 | AlTiN(67:33)/TiAlN(5:5)/AlCrN(5:5)/TiAlN(5:5) | 0.17 | 20 | 4.3 | SINGLE/MULTILAYER |
| | 14 | AlCrN(5:5) | 0.16 | AlTiN(67:33)/TiAlN(5:5)/AlCrN(5:5)/TiAlN(5:5) | 0.17 | 20 | 4.3 | SINGLE/MULTILAYER |
| | 15 | AlCrN(7:3) | 0.18 | AlTiN(67:33)/TiAlN(5:5)/AlCrN(5:5)/TiAlN(5:5) | 0.14 | 19 | 4.1 | SINGLE/MULTILAYER |
| | 16 | AlCrN(5:5) | 0.06 | AlTiN(67:33)/TiAlN(5:5)/AlCrN(5:5)/TiAlN(5:5) | 0.16 | 19 | 4.0 | SINGLE/MULTILAYER |
| | 17 | AlCrN(7:3) | 0.06 | AlTiN(67:33)/TiAlN(5:5)/AlCrN(7:3)/TiAlN(5:5) | 0.17 | 20 | 4.1 | SINGLE/MULTILAYER |
| | 18 | TiAlN(5:5) | 0.16 | AlTiN(67:33)/TiAlN(5:5)/AlCrN(5:5)/TiAlN(5:5) | 0.17 | 19 | 4.3 | SINGLE/MULTILAYER |
| | 19 | TiAlN(67:33) | 0.18 | AlTiN(67:33)/TiAlN(5:5)/AlCrN(5:5)/TiAlN(5:5) | 0.14 | 20 | 4.1 | SINGLE/MULTILAYER |
| | 20 | TiAlN(5:5) | 0.06 | AlTiN(67:33)/TiAlN(7:3)/AlCrN(5:5)/TiAlN(5:5) | 0.16 | 20 | 4.0 | SINGLE/MULTILAYER |
| | 21 | TiAlN(67:33) | 0.06 | AlTiN(67:33)/TiAlN(7:3)/AlCrN(5:5)/TiAlN(5:5) | 0.17 | 19 | 4.1 | SINGLE/MULTILAYER |

[FIG. 4]

| CLASSIFICATION | SAMPLE | THIN FILM STRUCTURE | | THIN FILM COMPOSITION (EDX, at%) | | | |
|---|---|---|---|---|---|---|---|
| | | SINGLE LAYER (TARGET COMPOSITION) | NANOSCALE MULTILAYER (TARGET COMPOSITION) | Al | Ti | Cr | N |
| COMPARATIVE EXAMPLE | 1 | TiAlN(5:5) | – | 27.1 | 28.9 | – | 44 |
| | 2 | AlTiN(67:33) | – | 37.4 | 19.4 | – | 43.2 |
| | 3 | AlCrN(5:5) | – | 26.6 | – | 28.9 | 44.5 |
| | 4 | AlCrN(7:3) | – | 35.8 | – | 18.5 | 45.7 |
| | 5 | – | TiAlN(5:5)/AlCrN(7:3) | 32.4 | 14 | 9.5 | 44.1 |
| | 6 | – | AlTiN(67:33)/AlCrN(7:3) | 35.2 | 9.5 | 9.4 | 45.9 |
| | 7 | – | TiAlN(5:5)/AlCrN(5:5) | 26.6 | 13.8 | 13.9 | 45.7 |
| | 8 | – | AlTiN(67:33)/AlCrN(5:5) | 30.7 | 8.6 | 14.6 | 46.1 |
| | 9 | – | AlTiN(67:33)/TiAlN(5:5)/AlCrN(5:5)/TiAlN(5:5) | 28 | 18.3 | 7.2 | 46.5 |
| | 10 | – | AlTiN(67:33)/TiAlN(5:5)/AlCrN(7:3)/TiAlN(5:5) | 32.1 | 18 | 4.1 | 45.8 |
| | 11 | TiAlN(5:5) | AlTiN(67:33)/TiAlN(5:5)/AlCrN(5:5)/TiAlN(5:5) | 29.3 | 10.7 | 14 | 46 |
| | 12 | TiAlN(67:33) | AlTiN(67:33)/TiAlN(5:5)/AlCrN(7:3)/TiAlN(5:5) | 34.4 | 11.1 | 8.1 | 46.4 |
| | 13 | TiAlN(5:5) | AlTiN(67:33)/TiAlN(5:5)/AlCrN(7:3)/TiAlN(5:5) | 29.0 | 28.0 | 4.1 | 43.0 |
| | 14 | AlCrN(5:5) | AlTiN(67:33)/TiAlN(5:5)/AlCrN(7:3)/TiAlN(5:5) | 30.6 | 20.3 | 4.1 | 45.0 |
| | 15 | AlCrN(7:3) | AlTiN(67:33)/TiAlN(5:5)/AlCrN(5:5)/TiAlN(5:5) | 25.9 | 17.1 | 28.3 | 45.8 |
| | 16 | AlCrN(5:5) | – | 29.2 | 17.8 | 7.1 | 46.6 |
| | 17 | AlCrN(7:3) | AlTiN(67:33)/TiAlN(5:5)/AlCrN(5:5)/TiAlN(5:5) | 37.1 | – | 17.5 | 45.4 |
| EXAMPLE | 18 | TiAlN(5:5) | AlTiN(67:33)/TiAlN(5:5)/AlCrN(5:5)/TiAlN(5:5) | 30.9 | 18.1 | 5 | 46.3 |
| | 19 | TiAlN(67:33) | AlTiN(67:33)/TiAlN(5:5)/AlCrN(5:5)/TiAlN(5:5) | 25.5 | – | 27.7 | 46.8 |
| | 20 | TiAlN(5:5) | AlTiN(67:33)/TiAlN(5:5)/AlCrN(7:3)/TiAlN(5:5) | 29.6 | 18.5 | 6.8 | 45.5 |
| | 21 | TiAlN(67:33) | AlTiN(67:33)/TiAlN(5:5)/AlCrN(7:3)/TiAlN(5:5) | 37.8 | – | 17.1 | 45.1 |
| | | | AlTiN(67:33)/TiAlN(5:5)/AlCrN(5:5)/TiAlN(5:5) | 31.7 | 18.5 | 4.4 | 45.4 |
| | | | AlTiN(67:33)/TiAlN(5:5)/AlCrN(5:5)/TiAlN(5:5) | 28.0 | 27.0 | – | 45 |
| | | | AlTiN(67:33)/TiAlN(5:5)/AlCrN(5:5)/TiAlN(5:5) | 37.1 | 22.7 | 8.6 | 31.6 |
| | | | AlTiN(67:33)/TiAlN(5:5)/AlCrN(7:3)/TiAlN(5:5) | 37.5 | 18.5 | – | 44 |
| | | | AlTiN(67:33)/TiAlN(5:5)/AlCrN(5:5)/TiAlN(5:5) | 36.1 | 23.5 | 9.8 | 30.6 |
| | | | AlTiN(67:33)/TiAlN(5:5)/AlCrN(5:5)/TiAlN(5:5) | 28.0 | 27.0 | – | 44.5 |
| | | | AlTiN(67:33)/TiAlN(5:5)/AlCrN(7:3)/TiAlN(5:5) | 40.1 | 22.5 | – | 32.3 |
| | | | AlTiN(67:33)/TiAlN(5:5)/AlCrN(5:5)/TiAlN(5:5) | 36.0 | 18.0 | 5.1 | 46.2 |
| | | | AlTiN(67:33)/TiAlN(5:5)/AlCrN(7:3)/TiAlN(5:5) | 37.9 | 21.3 | 4.8 | 36.0 |

[FIG. 5]

| CLASSIFICATION | SAMPLE | THIN FILM STRUCTURE | | ROOM TEMPERATURE HARDNESS (GPa), (25°C), NO HEAT TREATMENT | AGED HARDNESS (GPa) (900°C, 30min) | COEFFICIENT OF FRICTION (COF) | CRACK LENGTH (30kgf LOAD, μm) |
|---|---|---|---|---|---|---|---|
| | | SINGLE LAYER | NANOSCALE MULTILAYER | | | | |
| COMPARATIVE EXAMPLE | 1 | TiAlN | – | 32.4 | 24 | 0.7 | 64 |
| | 2 | AlTiN | – | 35.5 | 29 | 0.72 | 65 |
| | 3 | AlCrN | – | 31.1 | 27 | 0.3 | 46 |
| | 4 | AlCrN | – | 29.5 | 25.5 | 0.33 | 46 |
| | 5 | – | TiAlN/AlCrN | 35.4 | 32.4 | 0.5 | 58 |
| | 6 | – | AlTiN/AlCrN | 36.7 | 34.3 | 0.48 | 59 |
| | 7 | – | TiAlN/AlCrN | 34.8 | 32.1 | 0.41 | 58 |
| | 8 | – | AlTiN/AlCrN | 36 | 34.1 | 0.44 | 58 |
| | 9 | – | AlTiN/TiAlN/AlCrN/TiAlN | 38.5 | 36.5 | 0.6 | 60 |
| | 10 | – | AlTiN/TiAlN/AlCrN/TiAlN | 38.8 | 36.8 | 0.65 | 64 |
| EXAMPLE | 11 | TiAlN | AlTiN/AlCrN/TiAlN | 36.5 | 34.8 | 0.42 | 52 |
| | 12 | TiAlN | AlTiN/AlCrN/TiAlN | 36.2 | 32.7 | 0.46 | 53 |
| | 13 | TiAlN | AlTiN/TiAlN/AlCrN/TiAlN | 36.5 | 35.2 | 0.41 | 58 |
| | 14 | AlCrN | AlTiN/TiAlN/AlCrN/TiAlN | 37.3 | 36.1 | 0.35 | 51 |
| | 15 | AlCrN | AlTiN/TiAlN/AlCrN/TiAlN | 37.5 | 36.1 | 0.36 | 51 |
| | 16 | AlCrN | AlTiN/TiAlN/AlCrN/TiAlN | 37.9 | 36.4 | 0.41 | 48 |
| | 17 | AlCrN | AlTiN/TiAlN/AlCrN/TiAlN | 38.1 | 36.7 | 0.43 | 49 |
| | 18 | TiAlN | AlTiN/TiAlN/AlCrN/TiAlN | 38.9 | 37.7 | 0.42 | 52 |
| | 19 | TiAlN | AlTiN/TiAlN/AlCrN/TiAlN | 39.2 | 38.2 | 0.41 | 51 |
| | 20 | TiAlN | AlTiN/TiAlN/AlCrN/TiAlN | 38.3 | 37.1 | 0.39 | 50 |
| | 21 | TiAlN | AlTiN/TiAlN/AlCrN/TiAlN | 38.8 | 37.5 | 0.41 | 51 |

[FIG. 6]

| CLASSIFICATION | SAMPLE | THIN FILM STRUCTURE | | CUTTING LIFETIME (PROCESSING DISTANCE, m) | CAUSE OF END OF LIFETIME |
|---|---|---|---|---|---|
| | | SINGLE LAYER | NANOSCALE MULTILAYER | | |
| COMPARATIVE EXAMPLE | 1 | TiAlN | – | 7.8 | DAMAGE |
| | 2 | AlTiN | – | 8 | CHIPPING |
| | 3 | AlCrN | – | 2.5 | CHIPPING |
| | 4 | AlCrN | – | 2.5 | CHIPPING |
| | 5 | – | TiAlN/AlCrN | 10 | CHIPPING |
| | 6 | – | AlTiN/AlCrN | 10 | DAMAGE |
| | 7 | – | TiAlN/AlCrN | 10 | DAMAGE |
| | 8 | – | AlTiN/AlCrN | 10 | DAMAGE |
| | 9 | – | AlTiN/TiAlN/AlCrN/TiAlN | 13.6 | CHIPPING |
| | 10 | – | AlTiN/TiAlN/AlCrN/TiAlN | 14.1 | DAMAGE |
| | 11 | TiAlN | AlTiN/AlCrN/TiAlN | 12.1 | EXCESSIVE WEAR |
| | 12 | TiAlN | AlTiN/AlCrN/TiAlN | 12.2 | EXCESSIVE WEAR |
| EXAMPLE | 13 | TiAlN | AlTiN/TiAlN/AlCrN/TiAlN | 14.9 | NORMAL WEAR |
| | 14 | AlCrN | AlTiN/TiAlN/AlCrN/TiAlN | 14.8 | NORMAL WEAR |
| | 15 | AlCrN | AlTiN/TiAlN/AlCrN/TiAlN | 15 | NORMAL WEAR |
| | 16 | AlCrN | AlTiN/TiAlN/AlCrN/TiAlN | 16.8 | NORMAL WEAR |
| | 17 | AlCrN | AlTiN/TiAlN/AlCrN/TiAlN | 17 | NORMAL WEAR |
| | 18 | TiAlN | AlTiN/TiAlN/AlCrN/TiAlN | 15 | NORMAL WEAR |
| | 19 | TiAlN | AlTiN/TiAlN/AlCrN/TiAlN | 15.1 | NORMAL WEAR |
| | 20 | TiAlN | AlTiN/TiAlN/AlCrN/TiAlN | 15.1 | NORMAL WEAR |
| | 21 | TiAlN | AlTiN/TiAlN/AlCrN/TiAlN | 14.8 | NORMAL WEAR |

[FIG. 7]

| CLASSIFICATION | SAMPLE | THIN FILM STRUCTURE | | CUTTING LIFETIM (PROCESSING DISTANCE, m) | CAUSE OF END OF LIFETIME |
| --- | --- | --- | --- | --- | --- |
| | | SINGLE LAYER | NANOSCALE MULTILAYER | | |
| COMPARATIVE EXAMPLE | 1 | TiAlN | – | 3 | EXCESSIVE WEAR |
| | 2 | AlTiN | – | 3.1 | EXCESSIVE WEAR |
| | 3 | AlCrN | – | 1 | DAMAGE DUE TO EXCESSIVE WEAR |
| | 4 | AlCrN | – | 0.8 | DAMAGE DUE TO EXCESSIVE WEAR |
| | 5 | – | TiAlN/AlCrN | 2.1 | DAMAGE DUE TO EXCESSIVE WEAR |
| | 6 | – | AlTiN/AlCrN | 2.2 | DAMAGE DUE TO EXCESSIVE WEAR |
| | 7 | – | TiAlN/AlCrN | 2.1 | DAMAGE DUE TO EXCESSIVE WEAR |
| | 8 | – | AlTiN/AlCrN | 2.2 | DAMAGE DUE TO EXCESSIVE WEAR |
| | 9 | – | AlTiN/TiAlN/AlCrN/TiAlN | 4.5 | CHIPPING |
| | 10 | – | AlTiN/TiAlN/AlCrN/TiAlN | 4.8 | CHIPPING |
| | 11 | TiAlN | AlTiN/AlCrN/TiAlN | 8.0 | EXCESSIVE WEAR |
| | 12 | TiAlN | AlTiN/AlCrN/TiAlN | 7.1 | EXCESSIVE WEAR |
| | 13 | TiAlN | AlTiN/TiAlN/AlCrN/TiAlN | 10.0 | EXCESSIVE WEAR |
| | 14 | AlCrN | AlTiN/TiAlN/AlCrN/TiAlN | 9.5 | EXCESSIVE WEAR |
| | 15 | AlCrN | AlTiN/TiAlN/AlCrN/TiAlN | 10.0 | EXCESSIVE WEAR |
| | 16 | AlCrN | AlTiN/TiAlN/AlCrN/TiAlN | 9.5 | EXCESSIVE WEAR |
| | 17 | AlCrN | AlTiN/TiAlN/AlCrN/TiAlN | 9.8 | EXCESSIVE WEAR |
| EXAMPLE | 18 | TiAlN | AlTiN/TiAlN/AlCrN/TiAlN | 13.0 | NORMAL WEAR |
| | 19 | TiAlN | AlTiN/TiAlN/AlCrN/TiAlN | 13.5 | NORMAL WEAR |
| | 20 | TiAlN | AlTiN/TiAlN/AlCrN/TiAlN | 13.0 | NORMAL WEAR |
| | 21 | TiAlN | AlTiN/TiAlN/AlCrN/TiAlN | 13.2 | NORMAL WEAR |

[FIG. 8]

| CLASSIFICATION | SAMPLE | THIN FILM STRUCTURE | | CUTTING LIFETIME (PROCESSING DISTANCE, m) |
|---|---|---|---|---|
| | | SINGLE LAYER | NANOSCALE MULTILAYER | |
| COMPARATIVE EXAMPLE | 1 | TiAlN | — | 2.9 |
| | 2 | AlTiN | — | 2.8 |
| | 3 | AlCrN | — | 0.8 |
| | 4 | AlCrN | — | 1 |
| | 5 | — | TiAlN/AlCrN | 3.2 |
| | 6 | — | AlTiN/AlCrN | 3 |
| | 7 | — | TiAlN/AlCrN | 3.2 |
| | 8 | — | AlTiN/AlCrN | 3.5 |
| | 9 | — | AlTiN/TiAlN/AlCrN/TiAlN | 4.1 |
| | 10 | — | AlTiN/TiAlN/AlCrN/TiAlN | 3.2 |
| | 11 | TiAlN | AlTiN/AlCrN/TiAlN | 7.1 |
| | 12 | TiAlN | AlTiN/AlCrN/TiAlN | 7.1 |
| EXAMPLE | 13 | TiAlN | AlTiN/TiAlN/AlCrN/TiAlN | 8.5 |
| | 14 | AlCrN | AlTiN/TiAlN/AlCrN/TiAlN | 8.6 |
| | 15 | AlCrN | AlTiN/TiAlN/AlCrN/TiAlN | 8.1 |
| | 16 | AlCrN | AlTiN/TiAlN/AlCrN/TiAlN | 8.6 |
| | 17 | AlCrN | AlTiN/TiAlN/AlCrN/TiAlN | 9.3 |
| | 18 | TiAlN | AlTiN/TiAlN/AlCrN/TiAlN | 8.5 |
| | 19 | TiAlN | AlTiN/TiAlN/AlCrN/TiAlN | 8.8 |
| | 20 | TiAlN | AlTiN/TiAlN/AlCrN/TiAlN | 8.9 |
| | 21 | TiAlN | AlTiN/TiAlN/AlCrN/TiAlN | 8.2 |

[FIG. 9]

| CLASSIFICATION | SAMPLE | THIN FILM STRUCTURE | | CUTTING LIFETIME (hole: 20-90mm) | CAUSE OF END OF LIFETIME |
|---|---|---|---|---|---|
| | | SINGLE LAYER | NANOSCALE MULTILAYER | | |
| COMPARATIVE EXAMPLE | 1 | TiAlN | — | 52 | Fused/EXCESSIVE WEAR |
| | 2 | AlTiN | — | 52 | Fused/CHIPPING |
| | 3 | AlCrN | — | 16 | EXCESSIVE WEAR |
| | 4 | AlCrN | — | 10 | EXCESSIVE WEAR |
| | 5 | — | TiAlN/AlCrN | 80 | CHIPPING |
| | 6 | — | AlTiN/AlCrN | 80 | Fused/CHIPPING |
| | 7 | — | TiAlN/AlCrN | 80 | EXCESSIVE WEAR |
| | 8 | — | AlTiN/AlCrN | 82 | EXCESSIVE WEAR |
| | 9 | — | AlTiN/TiAlN/AlCrN/TiAlN | 104 | CHIPPING |
| | 10 | — | AlTiN/TiAlN/AlCrN/TiAlN | 104 | Fused/CHIPPING |
| | 11 | TiAlN | AlTiN/AlCrN/TiAlN | 190 | EXCESSIVE WEAR |
| | 12 | TiAlN | AlTiN/AlCrN/TiAlN | 185 | EXCESSIVE WEAR |
| EXAMPLE | 13 | TiAlN | AlTiN/TiAlN/AlCrN/TiAlN | 230 | NORMAL WEAR |
| | 14 | AlCrN | AlTiN/TiAlN/AlCrN/TiAlN | 230 | NORMAL WEAR |
| | 15 | AlCrN | AlTiN/TiAlN/AlCrN/TiAlN | 230 | NORMAL WEAR |
| | 16 | AlCrN | AlTiN/TiAlN/AlCrN/TiAlN | 256 | NORMAL WEAR |
| | 17 | AlCrN | AlTiN/TiAlN/AlCrN/TiAlN | 256 | NORMAL WEAR |
| | 18 | TiAlN | AlTiN/TiAlN/AlCrN/TiAlN | 230 | NORMAL WEAR |
| | 19 | TiAlN | AlTiN/TiAlN/AlCrN/TiAlN | 230 | NORMAL WEAR |
| | 20 | TiAlN | AlTiN/TiAlN/AlCrN/TiAlN | 256 | NORMAL WEAR |
| | 21 | TiAlN | AlTiN/TiAlN/AlCrN/TiAlN | 256 | NORMAL WEAR |

[FIG. 10]

| CLASSIFICATION | SAMPLE | THIN FILM STRUCTURE | | CUTTING LIFETIME (hole: 20-90mm) | CAUSE OF END OF LIFETIME |
|---|---|---|---|---|---|
| | | SINGLE LAYER | NANOSCALE MULTILAYER | | |
| COMPARATIVE EXAMPLE | 1 | TiAlN | – | 56 | EXCESSIVE WEAR |
| | 2 | AlTiN | – | 56 | EXCESSIVE WEAR |
| | 3 | AlCrN | – | 2 | DAMAGE DUE TO EXCESSIVE WEAR |
| | 4 | AlCrN | – | 2 | DAMAGE DUE TO EXCESSIVE WEAR |
| | 5 | – | TiAlN/AlCrN | 15 | EXCESSIVE WEAR |
| | 6 | – | AlTiN/AlCrN | 11 | EXCESSIVE WEAR |
| | 7 | – | TiAlN/AlCrN | 12 | DAMAGE DUE TO EXCESSIVE WEAR |
| | 8 | – | AlTiN/AlCrN | 15 | EXCESSIVE WEAR |
| | 9 | – | AlTiN/TiAlN/AlCrN/TiAlN | 80 | CHIPPING |
| | 10 | – | AlTiN/TiAlN/AlCrN/TiAlN | 42 | CHIPPING |
| | 11 | TiAlN | AlTiN/AlCrN/TiAlN | 85 | EXCESSIVE WEAR |
| | 12 | TiAlN | AlTiN/AlCrN/TiAlN | 90 | EXCESSIVE WEAR |
| | 13 | TiAlN | AlTiN/TiAlN/AlCrN/TiAlN | 104 | EXCESSIVE WEAR |
| | 14 | AlCrN | AlTiN/TiAlN/AlCrN/TiAlN | 104 | EXCESSIVE WEAR |
| | 15 | AlCrN | AlTiN/TiAlN/AlCrN/TiAlN | 104 | EXCESSIVE WEAR |
| | 16 | AlCrN | AlTiN/TiAlN/AlCrN/TiAlN | 104 | EXCESSIVE WEAR |
| | 17 | AlCrN | AlTiN/TiAlN/AlCrN/TiAlN | 104 | EXCESSIVE WEAR |
| EXAMPLE | 18 | TiAlN | AlTiN/TiAlN/AlCrN/TiAlN | 156 | NORMAL WEAR |
| | 19 | TiAlN | AlTiN/TiAlN/AlCrN/TiAlN | 156 | NORMAL WEAR |
| | 20 | TiAlN | AlTiN/TiAlN/AlCrN/TiAlN | 156 | NORMAL WEAR |
| | 21 | TiAlN | AlTiN/TiAlN/AlCrN/TiAlN | 156 | NORMAL WEAR |

HARD COATING FILM FOR CUTTING TOOLS

CROSS REFERENCE TO PRIOR APPLICATIONS

This application is a National Stage Application of PCT International Patent Application No. PCT/KR2014/007962 filed on Aug. 27, 2014, under 35 U.S.C. §371, which claims priority to Korean Patent Application No. 10-2013-0107733 filed on Sep. 9, 2013, which are all hereby incorporated by reference in their entirety.

TECHNICAL FIELD

The present invention relates to a hard coating film which is used for cutting tools and formed on a hard base material such as cemented carbide or cermet. More specifically, the present invention relates to a hard coating film having a structure in which a lower layer formed adjacently on a hard base material such as cemented carbide and an upper layer formed on the lower layer are alternately laminated. The upper layer has a nanoscale multilayered structure including a thin layer A, a thin layer B, a thin layer C, and a thin layer D, or has a repetitively laminated structure thereof such that the toughness and wear resistance are both improved when compared to a typical multilayered structure.

BACKGROUND ART

As industry tends toward precision, speed, and mass production, there is a need for improving the cutting performance and lifetime of cutting tools. In particular, during high-speed cutting of a workpiece having a high hardness or when cutting a difficult-to-cut material having a low thermal conductivity, high heat of at least 900° C. is generated locally at an end of an insert which is under friction with the workpiece. By forming a hard coating film having superb oxidation resistance and wear resistance on a cutting surface of the insert, the lifetime of the cutting tool may be extended.

Typically, a single-layered hard coating film, such as TiN, $Al_2O_3$, TiAlN, AlTiN, or AlCrN, having wear resistance, oxidation resistance, or shock resistance, and the like, or a multilayered hard coating film in which at least two of such layers are laminated were formed on a base material of a cemented carbide, a cermet, an end mill, or a drill, and the like, to address the requirements related to workpieces having a high hardness or difficult-to-cut materials.

However, the hardness of workpieces is increasing and demand for processing difficult-to-cut materials having a low thermal conductivity and a severe tendency to become fused to tools is also increasing, and thus it is becoming increasingly difficult to respond to such demands merely through the development of thin film compositions having novel physical properties or through the use of simple multilayered structures.

Accordingly, attempts to improve the cutting performance through a method in which two or more nano-level thin films having different physical properties are regularly and repeatedly laminated have increased recently.

For example, Korean Patent No. 876366 discloses a thin film structure in which the erosion resistance and oxidation resistance of the top layer are improved through a structure formed by depositing an underlayer on inserts, end mills, drills, or cermet tools, which are cemented carbide tools, using physical vapor deposition (PVD) to improve the adhesiveness and for crystal orientation in a (200) plane, and successively depositing a (Ti,Al)N multilayered thin film, which is an intermediate layer and then a top layer composed of an A layer, a B layer, a C layer, and a D layer, which are composed of TiAlN or AlTiSiN and have different compositions from each other.

Through such a multilayered structure, the wear resistance and oxidation resistance may be improved, but development of a hard coating film having a novel structure is needed to improve the various properties such as wear resistance, shock resistance (toughness), and chipping resistance which are needed for the cutting process.

For this, the present inventors, as disclosed in Korean Patent No. 1284766, have disclosed a hard coating film which is formed on the surface of a base material, the hard coating film for cutting tools being characterized by having a structure in which a first layer and a second layer are alternately laminated, the first layer being composed of $Al_{1-x}Cr_xN$ (0.3≤x≤0.7), the second layer consisting of a nanoscale multilayered structure or a structure in which the nanoscale multilayered structure is repeatedly laminated at least two times, the nanoscale multilayered structure including a thin layer A, a thin layer B, a thin layer C, and a thin layer D having thicknesses of 3 nm to 20 nm, the thin layer A being composed of $Al_{1-a-b}Ti_aSi_bN$ (0.3≤a≤0.7, 0≤b≤0.1), the thin layer B and the thin layer D being composed of $Ti_{1-x}Al_xN$ (0.3≤x≤0.7), the thin layer C being composed of $Al_{1-z}Cr_zN$ (0.3≤z≤0.7), and the aluminum (Al) content in the thin layer A differing from the aluminum (Al) content in the thin layer B.

Through the above described structure, the hard coating film having improved toughness (shock resistance), chipping resistance, and lubricity was obtained, but a hard coating film that is further improved in terms of wear resistance is needed.

DISCLOSURE OF THE INVENTION

Technical Problem

An object of the present invention is to provide a hard coating film for cutting tools, the hard coating film being improved overall in terms of toughness (shock resistance), chipping resistance, lubricity, and the like, and in particular, having a significantly improved wear resistance, and thus capable of further extending the lifetime of the cutting tools.

Technical Solution

In order to overcome the above problem, the present invention provides a hard coating film for cutting tools, the hard coating film being formed on the surface of a base material and having a structure in which a first layer and a second layer are alternately laminated at least two times, wherein the first layer is composed of a TiAl nitride having a composition of $Ti_{1-a}Al_a$ (0.3≤a≤0.7); and the second layer has a nanoscale multilayered structure or a structure in which the nanoscale multilayered structure is repeatedly laminated at least two times, the nanoscale multilayered structure including a thin layer A, a thin layer B, a thin layer C, and a thin layer D having thicknesses of 3 nm to 20 nm, where the thin layer A is composed of an AlTiSi nitride having a composition of $Al_{1-b-c}Ti_bSi_c$ (0.3≤b≤0.7, 0≤c≤0.1), the thin film B and the thin film D are composed of a TiAl nitride having a composition of $Ti_{1-d}Al_d$ (0.3≤d≤0.7), the thin film C is composed of a AlCr nitride having a composition of $Al_{1-e}Cr_e$ (0.3≤e≤0.7), the aluminum (Al) content in the thin layer A differs from the aluminum content in the thin layer B, and the nitrogen content in the first layer is greater than the nitrogen content in the second layer.

Moreover, in the hard coating film according to the present invention, in the first layer, the total nitrogen content with respect to metallic substances may be $(TiAl)_{1-x}N_x$ ($0.4 \le x \le 0.6$); and in the second layer, the total nitrogen content with respect to metallic substances may be $(AlTiCrSi)_{1-y}N_y$ ($0.1 \le y \le 0.5$).

In addition, in the hard coating film according to the present invention, when alternately laminating the first layer and the second layer, the difference in the nitrogen content may be controlled at regular intervals.

Moreover, in the hard coating film according to the present invention, the ratio of the thickness of the first layer to the thickness of the second layer ($T_1/T_2$) may be at least 0.1 and less than 1.0; and the thickness of the alternately laminated structure of the first layer and the second layer may be 1.0 μm to 20.0 μm.

In addition, in the hard coating film according to the present invention, the nanoscale multilayered structure may have the thin layers A, B, C and D which are laminated in this order.

Advantageous Effects

Unlike a typical hard coating film, in a hard coating film for cutting tools according to the present invention, the hard coating film having an improved wear resistance compared to a typical hard coating film may be obtained by using a TiAlN based single layer as the single layer which is alternately/repetitively laminated.

Moreover, by setting the nitrogen content in a first layer which is composed of a single layer to be higher than the nitrogen content in a second layer which is composed of a multilayered thin film, and periodically repeating this, the shock resistance, chipping resistance, lubricity, and also, in particular, the wear resistance is improved such that the lifetime of cutting tools is extended in various environments.

BRIEF DESCRIPTION OF THE DRAWINGS

FIG. 1 is a cross-sectional view schematically illustrating the structure of a hard coating film according to the present invention.

FIG. 2 is a schematic diagram for describing an arrangement of a target and a material to be coated which are inside of a coating furnace for forming a coating layer according to an embodiment of the present invention.

FIG. 3 is a table showing structures and compositions of hard thin films according to examples and comparative examples of the present invention.

FIG. 4 is a table showing results from component analyses of hard thin films prepared according to examples and comparative examples of the present invention.

FIG. 5 is a table showing results from evaluations of the crack resistance (toughness) of hard thin films prepared according to examples and comparative examples of the present invention.

FIG. 6 is a table showing results from carbon steel milling testing of hard thin films prepared according to examples and comparative examples of the present invention.

FIG. 7 is a table showing results from alloy steel milling testing of hard thin films prepared according to examples and comparative examples of the present invention.

FIG. 8 shows alloy steel group 3 partition plate milling testing of hard thin films prepared according to examples and comparative examples of the present invention.

FIG. 9 is a table showing results from carbon steel drilling testing of hard thin films prepared according to examples and comparative examples of the present invention.

FIG. 10 is a table showing results from alloy steel drilling testing of hard thin films prepared according to examples and comparative examples of the present invention.

MODE FOR CARRYING OUT THE INVENTION

Hereinafter, exemplary embodiments of the present invention are described in detail with reference to the accompanying drawings. However, the following exemplary embodiments of the present invention may be modified as different forms, and the scope of the present invention is not limited to the embodiments described below. Embodiments of the present invention are provided to better convey the present invention to a person with ordinary skill in the art. Moreover, it will be understood that dimensions or thicknesses of films or areas in the accompanying drawings may be exaggerated for better understanding of the present invention.

FIG. 1 is a cross-sectional view schematically illustrating the structure of a physical vapor deposition (PVD) hard coating film for cutting tools according to the present invention. As illustrated, the hard coating film according to the present invention is characterized by having a structure in which a first layer (lower layer), which is formed on a base material, and a second layer (wear resistant layer), which is formed on the first layer, are alternately laminated.

The first layer is a thin film of which the main object is improving the toughness (shock resistance), and the composition thereof is characterized by being composed of a TiAl nitride having a composition of $Ti_{1-a}Al_a$ ($0.3 \le a \le 0.7$). When a cutting operation is performed, a high temperature and high pressure environment is formed on the cutting tool. When the content (a) of aluminum (Al) is below 0.3, the solid solution strengthening effect of Al is reduced, and thus interatomic slip easily occurs in the high temperature and high pressure environment such that wear and chipping easily occurs. Consequently, the lifetime of the tool is reduced. When the content of aluminum exceeds 0.7, the crystal structure changes from fcc-TiAlN to hcp-AlTiN, and thus, since brittleness is increased such that the wear resistance is reduced and chipping and damage, and the like, easily occur, the lifetime of the tool is reduced. Therefore, the content (a) of Al is desirably 0.3 to 0.7.

Moreover, the unit thickness of the first layer is desirably 0.01 μm to 10 μm.

The second layer is a thin film which mainly improves the wear resistance and is characterized by having a nanoscale multilayered structure or a structure in which the nanoscale multilayered structure is repeatedly laminated at least two times, the nanoscale multilayered structure including a thin layer A, a thin layer B, a thin layer C, and a thin layer D having layer thicknesses of 3 nm to 20 nm. Typically, as the intervals between the nanoscale multilayers are reduced, the generation and movement of dislocations are suppressed such that the thin film is strengthened. When the thickness of the thin layer is less than 3 nm and thus excessively thin, the boundaries, which are between the nanoscale multilayers and suppress the generation and movement of dislocations, become ambiguous such that a mixing zone is formed through interdiffusion between the two layers. Consequently, the hardness and elastic modulus are reduced, and thus it is advantageous for the thickness to be no less than 3 nm. When the thickness exceeds 20 nm, the generation of the dislocations becomes easier and the movement of the dislocations becomes easier. Thus, the hardness and elastic modulus are reduced and, due to the formation of misfit dislocations, there is a decrease in the coherency strain energy, which may be accompanied by a decrease in the strengthening effect. Therefore, the thickness is desirably 3 nm to 20 nm. The laminated structure of the thin layer may be laminated to be various forms such as A/B/C/D, A/D/C/B, B/A/D/C, or D/A/C/B, and a form in which the first layer does not contact the C layer, and the B layer or the D layer is disposed between the A layer and the C layer is desirable.

Moreover, the thin layer A is desirably composed of an AlTiSi nitride having a composition of $Al_{1-b-c}Ti_bSi_c$ ($0.3 \leq b \leq 0.7$, $0 \leq c \leq 0.1$). This is because, when the content (b) of Ti is less than 0.3, the brittleness increases due to the formation of a phase having a hexagonal B4 structure, and thus the wear resistance is reduced and the lifetime of the tool is reduced, and when the content (b) exceeds 0.7, a smaller amount of the Al, which has a smaller atomic radius than Ti, is employed by being substituted for the Ti, and therefore the hardness and wear resistance of the thin film is reduced and $TiO_2$ oxide is more easily formed in a high temperature environment during a cutting operation such that the Ti elements inside of the thin film may diffuse to the outside and cause a decrease in high temperature hardness due to the depletion of the Ti elements. In addition, 0.1 or less content (c) of Si may be selectively included in the thin layer A. This is because when a small amount (appropriate amount), that is, 0.1 or less content (c) of Si is added, an amorphous $Si_3N_4$ phase is formed along the grain boundary of the crystalline AlTiN phase to reduce the size of the crystalline particles, and thus the hardness and wear resistance are improved. Also, during the high temperature cutting operation, the amorphous $Si_3N_4$ phase may form an $SiO_2$ oxide to perform the role of blocking the diffusion of internal elements to the outside, and thus improve the lifetime of the cutting tool. However, this is because, when the content (c) of Si exceeds 0.1, since the amorphous $Si_3N_4$ phase is increased such that the hardness is reduced and the particle size-reducing effect of the crystalline AlTiN phase is reduced, the Si may cause the wear resistance to be reduced.

Furthermore, the thin layer B and the thin layer D are desirably composed of a TiAl nitride having a composition of $Ti_{1-d}Al_d$ ($0.3 \leq d \leq 0.7$). This is because, when the content (d) of Al is less than 0.3, a smaller amount of the Al, which has a smaller atomic radius than Ti, is employed by being substituted for the Ti, and therefore the hardness and wear resistance of the thin film is reduced and $TiO_2$ oxide is more easily formed in a high temperature environment during a cutting operation such that the Ti elements inside of the thin film may diffuse to the outside and cause a decrease in high temperature hardness due to the depletion of the Ti elements, and when the content (d) exceeds 0.7, the brittleness increases due to the formation of a phase having a hexagonal B4 structure, and thus the wear resistance is reduced and the lifetime of the tool may be reduced.

In addition, the thin layer C is desirably composed of a AlCr nitride having a composition of $Al_{1-e}Cr_e$ ($0.3 \leq e \leq 0.7$). When the content (e) of Cr is less than 0.3, the insulating property is increased such that direct current (DC) deposition is difficult due to the characteristics of the equipment, and hcp-AlCrN is formed instead of fcc-AlCrN such that brittleness is increased, and thus the wear resistance is reduced and the lifetime of the tool is shortened. When the content (e) exceeds 0.7, a coarse thin film structure is formed, and at the same time, segregation of $Cr_2N$ occurs during an operation, such as a cutting operation, which is accompanied by high temperature such that the wear resistance is reduced and the lifetime of the tool is reduced. Therefore, the content (x) of Cr is desirably 0.3 to 0.7.

Moreover, it is a differentiating feature of the hard coating film of the present invention in that, in terms of the nitride that forms the lower layer (the first layer), which is adjacent to the base material, and the nanoscale multilayer (the second layer), the repetitively laminated structure is formed while setting the nitrogen content in the lower layer (the first layer) to be in a state which is higher than the nitrogen content in the nanoscale multilayer (the second layer). (Desirably, the nitrogen content in the first layer is at least 10% higher, by atomic percentage, than the second layer.) Therefore, without significantly reducing the toughness, the content of the metal component in the nanoscale multilayer (the second layer), which is mainly for wear resistance, may be further increased to improve the overall wear resistance of the hard coating film.

As above, a feature of the present invention is that the toughness, wear resistance, and also the chipping resistance and lubricity may be improved in the entirety of the hard coating film by including a TiAl nitride in the lower layer (the first layer) adjacent to the base material in order to improve the toughness (shock resistance) and having a nanoscale multilayered structure (the second layer) that includes the thin layers A, B, C, and D in order to improve the wear resistance, and by alternately/repeatedly laminating the lower layer and the wear resistant layer and controlling the nitrogen content in the first layer and the second layer so as to be different.

Moreover, another feature is that the wear resistance may be improved through control of the composition between each of the layers while having as the nanoscale multilayer (the second layer), a combination of TiAlN, AlTiN, or AlCrN based coating films.

The Al content in the thin layer A must differ from the Al content in the thin layer B, and the difference in the Al content is desirably maintained at 0.1 or higher. This is because when the difference in the Al content is below 0.1, the difference in the elastic coefficient due to a change in the composition between nanoscale multilayers is not large, and thus there is a decrease in the strengthening effect of the thin film. In consideration of the above-given reasons for limiting values with respect to the compositions of thin layer A and thin layer B, it is advantageous for the difference in the Al content to be maintained at 0.1 to 0.2.

Moreover, the ratio of the thickness of the first layer to the thickness of the second layer ($T_1/T_2$) is desirably maintained to be at least 0.1 and less than 1.0. The reason being that when a crack is generated due to the application of a shock to the thin film, the repeated/alternated lamination of the second layer, which is a hard layer, and the first layer, which is a soft layer, has the effect of delaying the crack from propagating to the deeper layers, but when the thickness of the first layer is excessively thin (that is, below 0.1) compared to the thickness of the second layer, the effect of delaying the propagation of the crack is poor, and when the thickness of the first layer is thick compared to the thickness of the second layer (that is, at least 1.0), the effect of delaying the propagation of the crack is high, but the wear resistance of the entire thin film may be reduced due to the first layer, which is the soft layer, being thicker.

In addition, the thickness of the hard coating film in which the first layer and the second layer are alternately laminated is desirably 1.0 μm to 20.0 μm.

EXAMPLE

In an embodiment of the present invention, arc ion plating, which is a physical vapor deposition (PVD) technique, was used to coat a thin film having a structure such as FIG. 1 on a hard base material which includes cemented carbide, cermet, high speed steel, or drills, and the like.

Specifically, an arc target of AlTi, TiAl, or AlCr was used as the target used in the coating, the initial vacuum pressure was obtained by reducing the pressure to $8.5 \times 10^{-5}$ Torr or lower, and $N_2$ was introduced as a reactant gas. Moreover, while coating, the gas pressure for the coating was maintained at 30 mTorr or lower, desirably 20 mTorr or lower, the coating temperature was 400 to 550° C., and a substrate bias voltage of −20 V to −150 V was applied. Such coating conditions may be modified according to the properties and conditions of the equipment.

In an embodiment of the present invention, a single layer, which is a toughness layer, and a nanoscale multilayer, which is a wear resistant layer, were repeatedly and alternately laminated using the above coating conditions. Here, the hard thin film was obtained by alternately laminating a $Ti_{1-x}Al_xN$ film as the single layer (toughness layer), and each of a unit layer of $Al_yTi_{1-y}N$ film (thin layer A), a unit layer of $Ti_zAl_{1-z}N$ film (thin layer B), a unit layer of $Al_{1-x}Cr_xN$ film (thin layer C), and a unit layer of $Ti_zAl_{1-z}N$ film (thin layer D) using the laminating intervals (number of cycles) given in FIG. 3.

Moreover, in an embodiment of the present invention, when forming the single layer (toughness layer) and the nanoscale multilayer (wear resistant layer) composed of the thin layer A, the thin layer B, the thin layer C, and the thin layer D, the toughness layer was controlled to have a higher nitrogen content than the wear resistant layer. Here, control of the nitrogen content is achieved through a method in which the content of nitrogen being introduced as a process gas during the coating was continuously controlled inside of a pressure-controlled coating furnace.

Specifically, as illustrated in FIG. 2, when the coating layer was formed on a rotating object to be coated by arranging the targets for coating inside of the coating furnace on four sides so as to face each other and the object to be coated was rotated in the center of the coating furnace to face the targets for coating, and then a high current was applied to the targets for coating to evaporate the targets for coating and the evaporated targets for coating with the nitrogen gas which is introduced into the coating furnace were evaporated, the content of nitrogen included in the single layer and the nanoscale multilayer which were formed were controlled to be different in an embodiment of the present invention through a method in which the nitrogen content introduced was increased when depositing the single layer and the nitrogen content introduced was decreased to be lower than the single layer when depositing the nanoscale multilayer.

Moreover, the hard coating film according to an embodiment of the present invention uses physical vapor deposition (PVD), and thus a thin film may be applied to a thickness of up to about 20 μm.

In addition, in an embodiment of the present invention, the hard coating film according to an embodiment of the present invention is formed on the surface of the hard base material, but another coating film layer may be additionally formed between the hard base material and the hard coating film according to an embodiment of the present invention.

Also, a total of four types of hard coating films were formed for comparison with the thin film according to an embodiment of the present invention.

Of these, each of specimen numbers 1 to 4 was a hard coating film composed of a single layer of TiAlN, AlTiN, or AlCrN and formed to a thickness of about 4 μm. These were for comparing the physical properties with the multilayered hard coating film. Moreover, each of specimen numbers 5 to 8 was a hard coating film formed to a thickness of about 4 μm by alternately laminating TiAlN/AlCrN about 18 to 20 times. These were for comparing the single layer coating film with the structure in which the single layer and the multilayered hard coating film were alternately laminated. Furthermore, specimen numbers 9 and 10 were hard coating films formed to a thickness of about 4 μm by alternately laminating four of the thin films such as AlTiN/TiAlN/AlCrN/TiAlN. These were for comparing the single layer coating film with the structure in which the single layer and the multilayered hard coating film were alternately laminated. In addition, specimen numbers 11 and 12 were hard coating films formed to a thickness of about 4 μm through alternated lamination of a single layer of TiAlN and a multilayered structure composed of three thin films, that is, AlTiN/AlCrN/TiAlN. These were for comparing the single layer of TiAlN according to an embodiment of the present invention with the alternately/repeatedly laminated structure of the multilayered structure composed of four thin films. Moreover, specimen number 13 has the same laminated structure as an embodiment of the present invention, but is for comparing the differences in the physical properties to the hard coating film when the difference in the nitrogen content in the first layer and the second layer differs from the present invention.

FIG. 4 displays the results from EDX analysis for each layer in the 21 samples. As observed in FIG. 4, in the case of the nitride according to an embodiment of the present invention, the first layer (single layer) is controlled to contain at least 10% more nitrogen, by atomic percentage, than the second layer (multilayered structure) through the method described above.

Evaluation of Microhardness and Coefficient of Friction

In order to evaluate the hardness of the total of 21 hard coating films prepared as above, heat treatment was used for heat treating under condition of 900° C. for about 30 minutes, and then the microhardness of the hard coating film before and after the heat treatment was measured using Fischerscope (HP100C-XYP; Germany HELMUT FISCHER GMBH, ISO14577).

<Microhardness Test Conditions>
Load: 30 mN
Unload: 30 mN
Load time: 10 sec
Unload time: 10 sec
Creep time: 5 sec In addition, the coefficient of friction according to the sliding distance was measured through a ball-on-disc test using a CETR UMT-2 micro-tribometer (ball (material $Si_3N_4$, diameter 4 mm, hardness $HV_{50g}1600$) rotated for 60 cycles).

<Coefficient of Friction Test Conditions>
Temperature: 20-25° C.
Relative humidity: 50-60%
Rotation speed: 318 rpm (10 m/min)

Moreover, in order to observe the crack resistance (toughness) of the thin film, the length of the crack generated by applying a diamond indenter having a load of 30 kgf was measured.

FIG. 5 displays the results from the above evaluation. As observed in FIG. 5, the hardness of the hard coating film according to an embodiment of the present invention was among the highest, and almost no aging occurs at high temperatures. Moreover, in terms of the coefficient of friction, the hard coating film according to an embodiment of the present invention was somewhat higher than the single layer of AlCrN, but may be observed to be lower than the other hard coating films. Furthermore, in terms of the crack length which represents the toughness of the thin film, equal or better toughness was exhibited compared to the hard coating films other than the specimen composed of the single layer of AlCrN and specimens 16 and 17 in which the single layer of AlCrN and the multilayered structure were repeatedly laminated. Therefore, it may be known that the hard coating film according to an embodiment of the present invention exhibits both hardness and toughness.

Evaluation of Wear Resistance

In order to evaluate the wear resistance of the hard coating film prepared according to FIG. 3, results from evaluating the milling cutting performance under two different conditions are shown. The conditions for the first cutting performance evaluation were as follows.

Workpiece: carbon steel (SM45C, carbon steel milling)
Sample type number: SPKN1504EDSR(ISO)
Cutting speed: 200 m/min
Cutting feed rate: 0.3 mm/tooth
Cutting depth: 2 mm In the above cutting test, the wear was mostly due to fusing and adhesive wear of chips produced when processing carbon steel, and the effect that the lubricity (coefficient of friction) of the thin film has on the cutting performance may be considered the largest variable.

FIG. 6 displays the results from the carbon steel milling test. As observed in FIG. 6, the hard coating film according to an embodiment of the present invention has both high hardness and a low friction coefficient, and thus in all cases the end of the lifetime was caused by normal wear, but for each of the specimens of comparative examples 1 to 12, the end of the lifetime was caused by abnormal wear such as damage, chipping, or excessive wear.

Next, in order to evaluate the milling cutting performance of the hard coating film, which is prepared according to FIG. 3, with respect to the alloy steel, the cutting performance was evaluated under the following conditions.

Workpiece: alloy steel (SCM440, alloy steel milling)
Sample type number: SPKN1504EDSR (ISO)
Cutting speed: 200 m/min
Cutting feed rate: 0.3 mm/tooth
Cutting depth: 2 mm Typically, when processing alloy steel, the wear is mostly due to mechanical friction wear, and thus the wear resistance (hardness, oxidation resistance) of the thin film may be considered a large variable.

FIG. 7 displays the results from the alloy steel milling test. As observed in FIG. 7, in all of the cutting performance tests using the alloy steel, the end of the lifetime of the hard coating film according to an embodiment of the present invention was caused by normal wear, but the end of the lifetime of the hard coating films according to comparative examples 1 to 17 were all caused by abnormal processes, and thus were observed to have a significantly lower cutting lifetime than the present invention.

Evaluation of Toughness

In order to evaluate the toughness of the hard coating film prepared according to FIG. 3 in an actual cutting environment, the results from evaluating the milling shock resistant cutting performance (interrupted evaluation) were evaluated under the following conditions. The evaluation was carried out until the insert was damaged.

Workpiece: alloy steel (SCM440, alloy steel group 3 partition plate milling)
Sample type number: SPKN1504EDSR (ISO)
Cutting speed: 200 m/min
Cutting feed rate: 0.2 mm/tooth
Cutting depth: 2 mm FIG. 8 displays the results from the alloy steel group 3 partition plate milling test. As observed in FIG. 8, the same level of cutting lifetime distance of at least 8 m is exhibited by the hard coating film according to an embodiment of the present invention, and by comparative examples 13 to 17, which have the same laminated structure as an embodiment of the present invention. Such cutting lifetimes may be observed as being significantly better than the other hard coating films.

Evaluation of Lubricity and Chipping Resistance

In order to compare the drilling properties of the hard coating film prepared according to FIG. 3, the drilling cutting performance with respect to carbon steel was first evaluated as follows. Typically, drilling has a lower cutting speed than milling and is carried out in wet conditions, and thus the lubricity (fusing resistance) and chipping resistance of the insert are extremely important. Among these, the end of the lifetime caused by wear due to fusing and chipping is the largest variable when drilling carbon steel.

Workpiece: carbon steel (SM45C, carbon steel drilling)
Sample type number: SPMT07T208/XOMT07T205 (indexable drill insert, 20Φ-5D)
Cutting speed: 150 m/min
Cutting feed rate: 0.1 mm/rev
Cutting depth: 90 mm (penetration)

FIG. 9 displays the results from the carbon steel drilling test. As observed in FIG. 9, the end of the lifetime of the hard coating film according to an embodiment of the present invention was caused by normal wear, and the end of the lifetime of comparative examples 13 to 17, which have the same laminated structure as an embodiment of the present invention was also caused by normal wear. Therefore, it may be observed that the hard coating film according to an embodiment of the present invention may also be appropriately used in the drilling of carbon steel.

Next, in order to compare the drilling properties of the hard coating film according to FIG. 3 with respect to the alloy steel, the cutting test was performed under the following conditions. In the drilling of alloy steel, the end of the lifetime caused by the mechanical wear/friction of the outermost portion of the insert and the chipping of the innermost portion is the largest variable.

Workpiece: alloy steel (SCM440, alloy steel drilling)
Sample type number: SPMT07T208/XOMT07T205 (indexable drill insert, 20Φ-5D)
Cutting speed: 150 m/min
Cutting feed rate: 0.1 mm/rev
Cutting depth: 90 mm (penetration)

FIG. 10 displays the results from the alloy steel drilling test. As observed in FIG. 10, it may be seen that in the drilling cutting test of the alloy steel, the lifetimes of all of the hard coating films, other than the hard coating film according to an embodiment of the present invention, were ended abnormally.

Through the results of various cutting tests such as above, it was confirmed that for the hard coating film according to an embodiment of the present invention, the overall toughness (shock resistance), chipping resistance, and lubricity, and the like, may be improved while also greatly improving, in particular, the wear resistance such that improved lifetime properties may be obtained, even under varied cutting conditions.

The invention claimed is:

1. A hard coating film for cutting tools, the hard coating film being formed on the surface of a base material and comprising a structure in which a first layer and a second layer are alternately laminated at least two times, wherein:
   the first layer is composed of a TiAl nitride having a composition of $Ti_{1-a}Al_a$ ($0.3 \le a \le 0.7$); and
   the second layer has a nanoscale multilayered structure or a structure in which the nanoscale multilayered structure is repeatedly laminated at least two times, the nanoscale multilayered structure including a thin layer A, a thin layer B, a thin layer C, and a thin layer D having thicknesses of 3 nm to 20 nm, where:
   the thin layer A is composed of an AlTiSi nitride having a composition of $Al_{1-b-c}Ti_bSi_c$ ($0.3 \le b \le 0.7$, $0 \le c \le 0.1$),
   the thin film B and the thin film D are composed of a TiAl nitride having a composition of $Ti_{1-d}Al_d$ ($0.3 \le d \le 0.7$),
   the thin film C is composed of a AlCr nitride having a composition of $Al_{1-e}Cr_e$ ($0.3 \le e \le 0.7$),
   the aluminum (Al) content in the thin layer A differs from the aluminum content in the thin layer B, and
   the nitrogen content in the first layer is at least 10% higher, by atomic percentage, than the second layer.

2. The hard coating film of claim 1, wherein:
   in the first layer, the total nitrogen content with respect to metallic substances is $(TiAl)_{1-x}N_x$ ($0.4 \le x \le 0.6$); and
   in the second layer, the total nitrogen content with respect to metallic substances is $(AlTiCrSi)_{1-y}N_y$ ($0.1 \le y \le 0.5$).

3. The hard coating film of claim 1, wherein:
   the ratio of the thickness of the first layer to the thickness of the second layer ($T_1/T_2$) is at least 0.1 and less than 1.0; and
   the thickness of the alternately laminated structure of the first layer and the second layer is 1.0 μm to 20.0 μm.

4. The hard coating film of claim 1, wherein the nanoscale multilayered structure has the thin layers A, B, C and D which are laminated in this order.

* * * * *